United States Patent
Doi et al.

(10) Patent No.: US 7,230,320 B2
(45) Date of Patent: Jun. 12, 2007

(54) ELECTRONIC CIRCUIT DEVICE WITH REDUCED BREAKING AND CRACKING

(75) Inventors: Hiroaki Doi, Tokyo (JP); Noriyoshi Urushiwara, Tokyo (JP); Akira Matsushita, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 254 days.

(21) Appl. No.: 10/628,443

(22) Filed: Jul. 29, 2003

(65) Prior Publication Data

US 2004/0159919 A1     Aug. 19, 2004

(30) Foreign Application Priority Data

Feb. 18, 2003   (JP)   ............................. 2003-039084

(51) Int. Cl.
  *H01L 23/498*   (2006.01)
  *H01L 25/16*   (2006.01)
  *H01L 23/48*   (2006.01)
  *H01L 23/495*   (2006.01)

(52) U.S. Cl. .............................. 257/666; 257/E23.036; 257/E23.051; 257/E23.066; 257/E25.031; 257/E23.023; 257/E23.043; 257/E23.052; 257/676; 257/775; 257/776; 257/723; 257/685; 257/686; 257/777; 257/702; 257/703; 257/705; 257/773; 257/528; 257/533; 257/712; 257/675; 257/724; 257/725; 257/728

(58) Field of Classification Search ........ 257/E23.036, 257/E23.051, E25.031, E23.066, E23.043, 257/E23.052, E23.092, 787, 676, 783, 666, 257/685, 686, 777, 702, 703, 705, 775, 776, 257/723–725

See application file for complete search history.

(56) References Cited

U.S. PATENT DOCUMENTS 4,195,193 A * 3/1980 Grabbe et al. ............. 174/52.4
4,933,744 A * 6/1990 Segawa et al. ............. 257/795

(Continued)

FOREIGN PATENT DOCUMENTS

EP   0484180 A1 *   1/1991

(Continued)

OTHER PUBLICATIONS

A. Nishimura et al., *IEEE Transactions on Components, Hybrids, and Manufacturing Technology*; vol. 12, No. 4, pp. 639-645 (Dec. 1989).
German Office Action dated May 3, 2006 including English Translation (Ten (10) pages).
Japanese Office Action dated Oct. 10, 2006 including English translation (three (3) pages).

Primary Examiner—Alexander Oscar Williams
(74) Attorney, Agent, or Firm—Crowell & Moring LLP

(57) ABSTRACT

In an electronic circuit device including a substrate including a front surface on which an electronic circuit element is mounted and a reverse surface opposite to the front surface in a thickness direction of the substrate, an electrically conductive terminal member electrically connected to the electronic circuit element, a lead frame extending perpendicular to the thickness direction to face the reverse surface in the thickness direction, and a sealing resin covering at least partially the electronic circuit element, substrate and lead frame while at least a part of the electrically conductive terminal member is prevented from being covered by the sealing resin, the substrate extends to project outward from an end of the lead frame in a transverse direction perpendicular to the thickness direction while the end of the lead frame is covered by the sealing resin.

21 Claims, 17 Drawing Sheets

U.S. PATENT DOCUMENTS

| | | | |
|---|---|---|---|
| 5,212,405 A * | 5/1993 | Oigawa | 257/672 |
| 5,455,453 A * | 10/1995 | Harada et al. | 257/675 |
| 5,475,259 A * | 12/1995 | Kasai et al. | 257/692 |
| 6,187,614 B1 * | 2/2001 | Takata et al. | 438/112 |
| 6,396,138 B1 | 5/2002 | Cheah | |
| 6,475,827 B1 * | 11/2002 | Lee et al. | 438/106 |
| 6,484,708 B2 * | 11/2002 | Hirakawa et al. | 123/647 |
| 6,559,525 B2 * | 5/2003 | Huang | 257/675 |
| 7,061,080 B2 * | 6/2006 | Jeun et al. | 257/676 |
| 2002/0192488 A1 | 12/2002 | Kurihara et al. | |
| 2003/0001252 A1 * | 1/2003 | Ku et al. | 257/686 |
| 2003/0201530 A1 * | 10/2003 | Kurihara et al. | 257/712 |
| 2004/0061217 A1 * | 4/2004 | Ku et al. | 257/708 |
| 2004/0084756 A1 * | 5/2004 | Kawakami et al. | 257/666 |
| 2004/0145043 A1 * | 7/2004 | Hayashi et al. | 257/696 |

FOREIGN PATENT DOCUMENTS

| | | | |
|---|---|---|---|
| JP | 63-5647 U | | 1/1988 |
| JP | 2-49140 U | | 4/1990 |
| JP | 5-82573 | * | 4/1993 |
| JP | 7-249729 A | | 9/1995 |
| JP | 09-232341 | | 9/1997 |
| JP | 10-116934 A | | 5/1998 |
| JP | 10-303341 A | | 11/1998 |
| JP | 2000-183241 | | 6/2000 |
| JP | 2003-115681 | * | 4/2003 |
| JP | 2004-273946 | * | 9/2004 |

* cited by examiner

ELECTRONIC CIRCUIT DEVICE WITH REDUCED BREAKING AND CRACKING

BACKGROUND OF THE INVENTION

The present invention relates to an electronic circuit device having an electronic circuit element, a substrate including a front surface on which the electronic circuit element is mounted and a reverse surface opposite to the front surface in a thickness direction of the substrate, an electrically conductive terminal member electrically connected to the electronic circuit element, a lead frame extending perpendicular to the thickness direction to face the reverse surface in the thickness direction, and a sealing resin covering at least partially the electronic circuit element, substrate and lead frame while at least a part of the electrically conductive terminal member is prevented from being covered by the sealing resin.

In a prior art electronic circuit device as disclosed by "Effect of Lead Frame Material on Plastic-Encapsulated IC Package Cracking Under Temperature Cycling" (writers: Asao Nishimura, Sueo Kawai and Gen Murakami, included by IEE TRANSACTIONS ON COMPONENTS, HYBRIDS, AND MANUFACTURING TECHNOLOGY, VOL. 12, NO. 4, pp 639-645 published in December 1989), JP-A-9-232341 and JP-A-2000-183241, an electronic circuit element and a metallic lead frame are joined with each other and encapsulated monolithically with a resin, for example, epoxy resin.

BRIEF SUMMARY OF THE INVENTION

An object of the present invention is to provide an electronic circuit device in which a break between a resin and a lead frame and/or a crack of the resin on an end of the lead frame is restrained.

In an electronic circuit device comprising, an electronic circuit element, a substrate including a front surface on which the electronic circuit element is mounted and a reverse surface opposite to the front surface in a thickness direction of the substrate, an electrically conductive terminal member electrically connected to the electronic circuit element, a lead frame extending perpendicular to the thickness direction to face the reverse surface in the thickness direction through an adhesive, and a sealing resin covering at least partially the electronic circuit element, substrate and lead frame while at least a part of the electrically conductive terminal member is prevented from being covered by the sealing resin, according to the present invention, in a cross sectional view taken along an imaginary plane passing the substrate and lead frame and extending parallel to the thickness direction, the substrate extends to project outward with respect to an end of the lead frame in a transverse direction perpendicular to the thickness direction while the end of the lead frame is covered by the sealing resin.

Since the substrate extends to project outward with respect to an end of the lead frame in a transverse direction perpendicular to the thickness direction while the end of the lead frame is covered by the sealing resin, a concentration of shearing stress between the resin and lead frame at the end of the lead frame is decreased so that an occurrence of a break between the lead frame and resin and/or a crack of the resin on the end of the lead frame is restrained.

The above structural distinctive feature is particularly effective for restraining the occurrence of a break between the lead frame and resin and/or the crack of the resin on the end of the lead frame in case of that a coefficient of linear expansion of the lead frame in the transverse direction is smaller than a coefficient of linear expansion of the sealing resin, that a difference in coefficient of linear expansion in the transverse direction between the substrate and the lead frame is smaller than a difference in coefficient of linear expansion in the transverse direction between the sealing resin and the lead frame, that the electronic circuit device further comprises a resin adhesive through which the lead frame is adhered to the reverse surface, that the lead frame is prevented from being formed on the substrate through a deposition process on the reverse surface (the deposition process includes at least one of spattering and plating), that the end of the lead frame is formed by a shearing process, and/or that the end of the lead frame is formed by an etching process.

The above structural distinctive feature is preferably applicable to a case of that the imaginary plane extends parallel to a longitudinal direction of the part of the electrically conductive terminal member, that the electronic circuit device comprises a plurality of the electrically conductive terminal members juxtaposed in an electrically conductive terminal member array direction, and the imaginary plane extends perpendicular to the electrically conductive terminal member array direction, and/or that the lead frame is formed in one-piece (so that the electronic circuit device comprises the single lead frame), a part of the lead frame in one-piece is prevented from being covered by the sealing resin to protrude from the sealing resin in a protruding direction perpendicular to the thickness and transverse directions, and the imaginary plane extends perpendicular to the protruding direction (in this case, the lead frame may have a surface facing to the reverse surface in the thickness direction and prevented from being covered by the sealing resin to protrude from the sealing resin in the protruding direction).

It is preferable that in the cross sectional view, the substrate extends to project outward in the transverse direction with respect to another end of the lead frame opposite to the end of the lead frame in the transverse direction if the another end of the lead frame is covered by the sealing resin. It is preferable that a part of the lead frame is prevented from being covered by the sealing resin to protrude from the sealing resin in a protruding direction perpendicular to the thickness and transverse directions, and a width between the another end and the end in the cross sectional view perpendicular is smaller than a width of the part of the lead frame in the transverse direction. It is preferable for securely preventing the occurrence of a break between the lead frame and resin and/or the crack of the resin on the end of the lead frame that in the cross sectional view, a width of the lead frame between the another end and the end is not more than 80% of a width of the substrate.

The above structural distinctive feature is preferably applicable to a case of that the electronic circuit element includes a semiconductor body whose main component is a semiconductor, and as seen in the thickness direction, the semiconductor body and the lead frame overlap with each other. In this case, the electronic circuit element may include at least one of a central processing unit and a power transistor, and/or as seen in the thickness direction, the whole of the semiconductor body may overlap with the lead frame.

It is preferable that the lead frame is prevented from being electrically connected to the electronic circuit element so that a heat energy is prevented from being generated by an electric power passing through the lead frame.

The present invention is particularly preferably applicable to a case of that the lead frame is metallic, and a main component of the substrate is a ceramic.

DETAILED DESCRIPTION OF THE INVENTION

Figure 1:
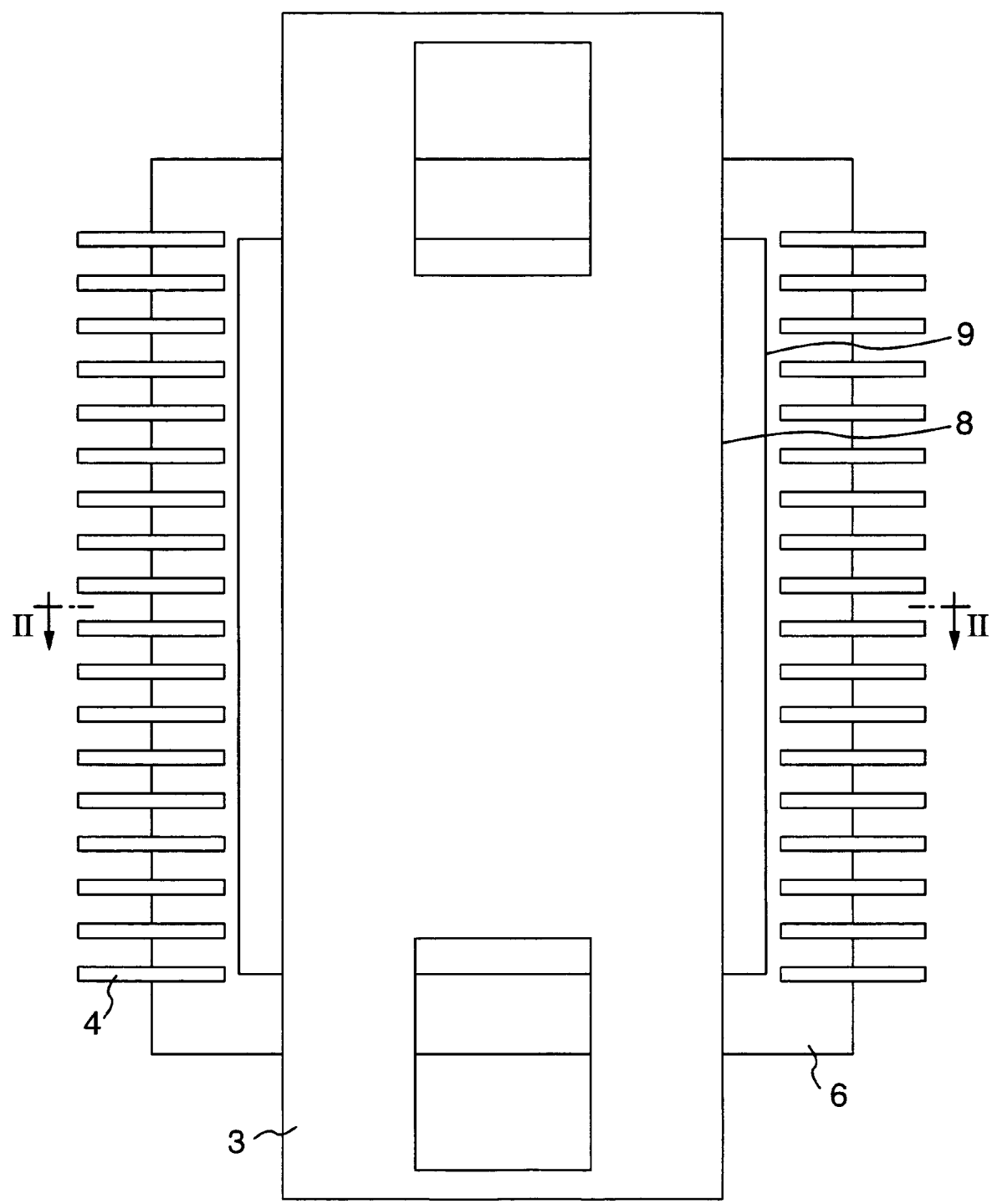
FIG. 1 is a lower view of an electronic circuit device as a first embodiment of the invention.
Figure 2:
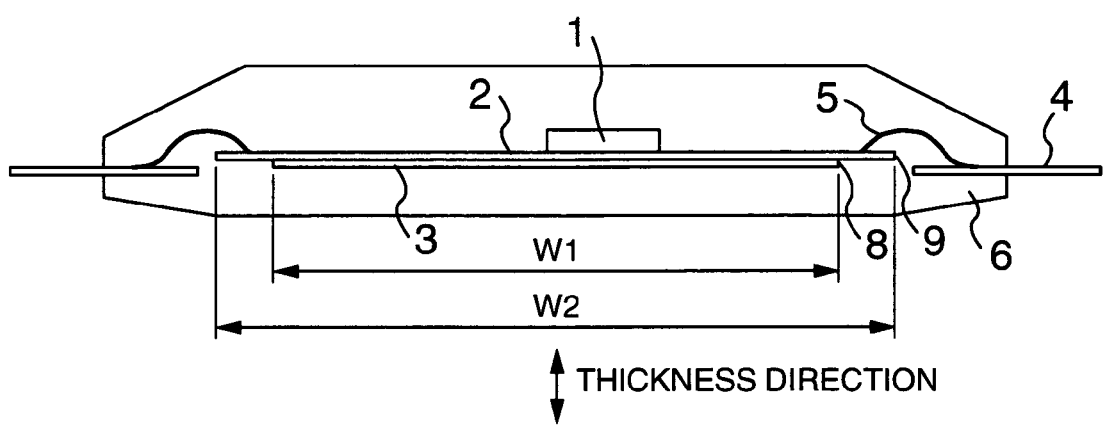
FIG. 2 is a cross sectional front view of the electronic circuit device taken along a line II-II in FIG. 1.
Figure 4:
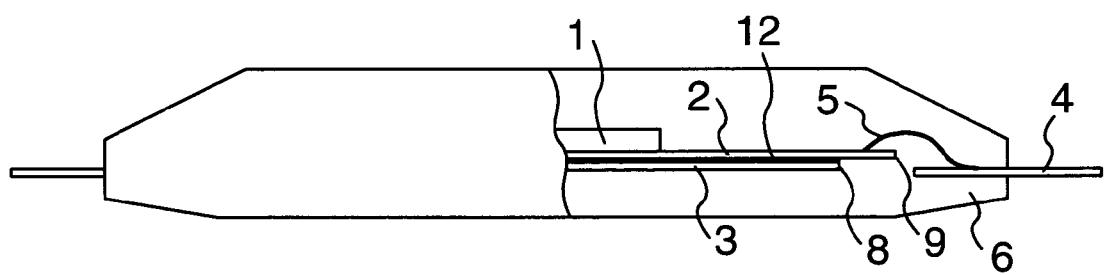
FIG. 4 is a partially cross sectional front view of the electronic circuit device as the first embodiment of the invention.
Figure 3:
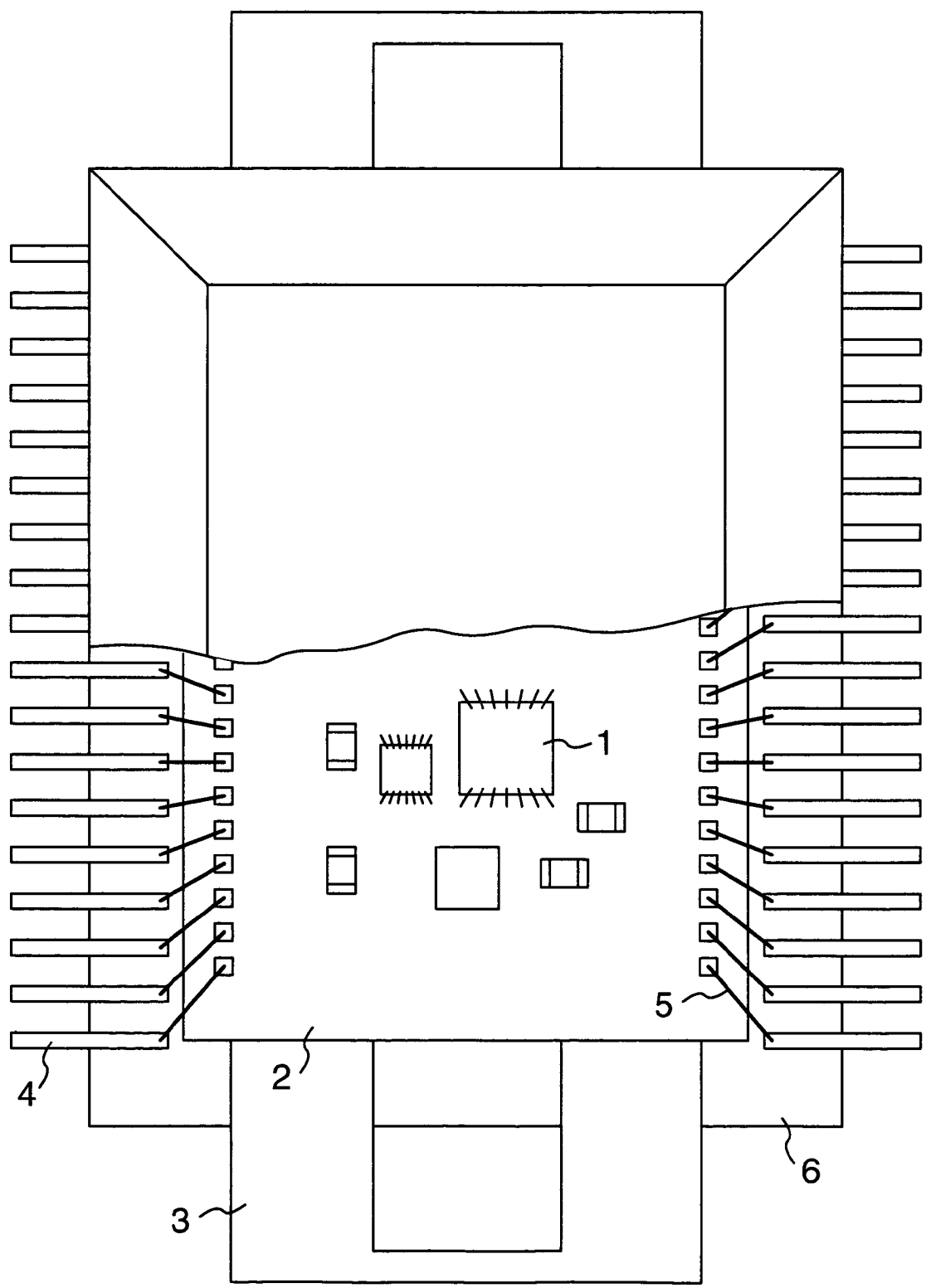
FIG. 3 is a partially cross sectional upper view of the electronic circuit device as the first embodiment.
Figure 5:
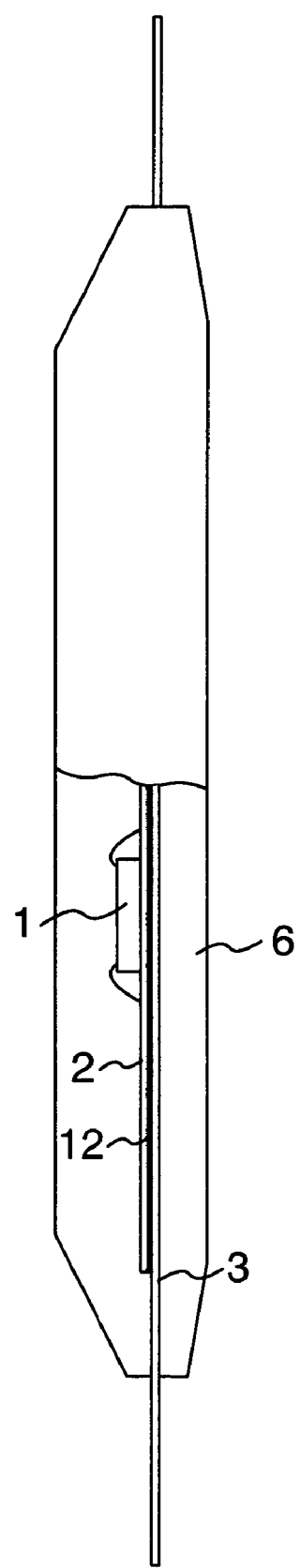
FIG. 5 is a partially cross sectional side view of the electronic circuit device as the first embodiment of the invention.

In a first embodiment of electronic circuit device as shown in FIGS. 1-5, a ceramic substrate 2 on which electronic circuit elements 1 are mounted is adhered to a lead frame 3 by an resin adhesive 12, the electronic circuit elements 1 are electrically connected to metallic leads 4 as the claimed electrically conductive terminal member through respective aluminum wires 5, and the electronic circuit elements 1, substrate 2, a part of the lead frame 3 and parts of the leads 4 are sealed by a resin 6. Another part of the lead frame 3 projects outward from the resin 6 in such a manner that a heat energy generated by the electronic circuit elements 1 is radiated to an outside of the electronic circuit device through the metallic lead frame 3. In a cross sectional view such as FIGS. 2 and 4 taken along an imaginary plane passing the substrate 2 and lead frame 3 and extending parallel to the thickness direction, the substrate extends to project outward with respect to each end 8 of the lead frame 3 in a transverse direction perpendicular to the thickness direction while the each end 8 of the lead frame 3 is covered by the sealing resin.

A part of the lead frame 3 and a part of the substrate 2 overlapping each other as seen in the thickness direction are adhered by the resin adhesive 12 to each other over the whole of a common area in which the part of the lead frame 3 and the part of the substrate 2 overlapping each other as seen in the thickness direction. A width W1 of the lead frame 3 in the transverse direction perpendicular to a lead frame protruding direction in which the lead frame 3 projects outward from the resin 6 and/or perpendicular to a lead (electrically conductive terminal member) array direction in which the leads 4 are juxtaposed is smaller than a width W2 of the substrate 2 in the transverse direction, in the common area as seen in the thickness direction. Both an upper end surface of the electronic circuit elements 1 and a lower end surface of the lead frame 3 are contained or covered by the resin 6.

The ceramic substrate 2 has a coefficient of linear expansion of about $7 \times 10^{-6} K^{-1}$, and the lead frame 3 is a stack of a pair of Cu plates and a low coefficient of linear expansion plate of Inver between the Cu plates and has a coefficient of linear expansion of about $8\text{-}10 \times 10^{-6} K^{-1}$. The resin 6 is an epoxy resin or the like (which resin 6 may include low linear expansion coefficient powder such as $SiO_2$ powder or the like) with a coefficient of linear expansion of about $15 \times 10^{-6} K^{-1}$.

A difference in coefficient of linear expansion between the substrate 2 and lead frame 3 is smaller than a difference in coefficient of linear expansion between the substrate 2 and resin 6, and a difference in coefficient of linear expansion between the substrate 2 and lead frame 3 is smaller than a difference in coefficient of linear expansion between the lead frame 3 and resin 6, although these differences are preferably as small as possible to restrain a break between the substrate 2 and lead frame 3 and/or between the lead frame 3 and resin 6. The lead frame 3 is metallic to have a great thermal conductivity for discharging a heat energy generated by the electronic circuit elements 1 to the outside of the resin 6.

Figure 20:
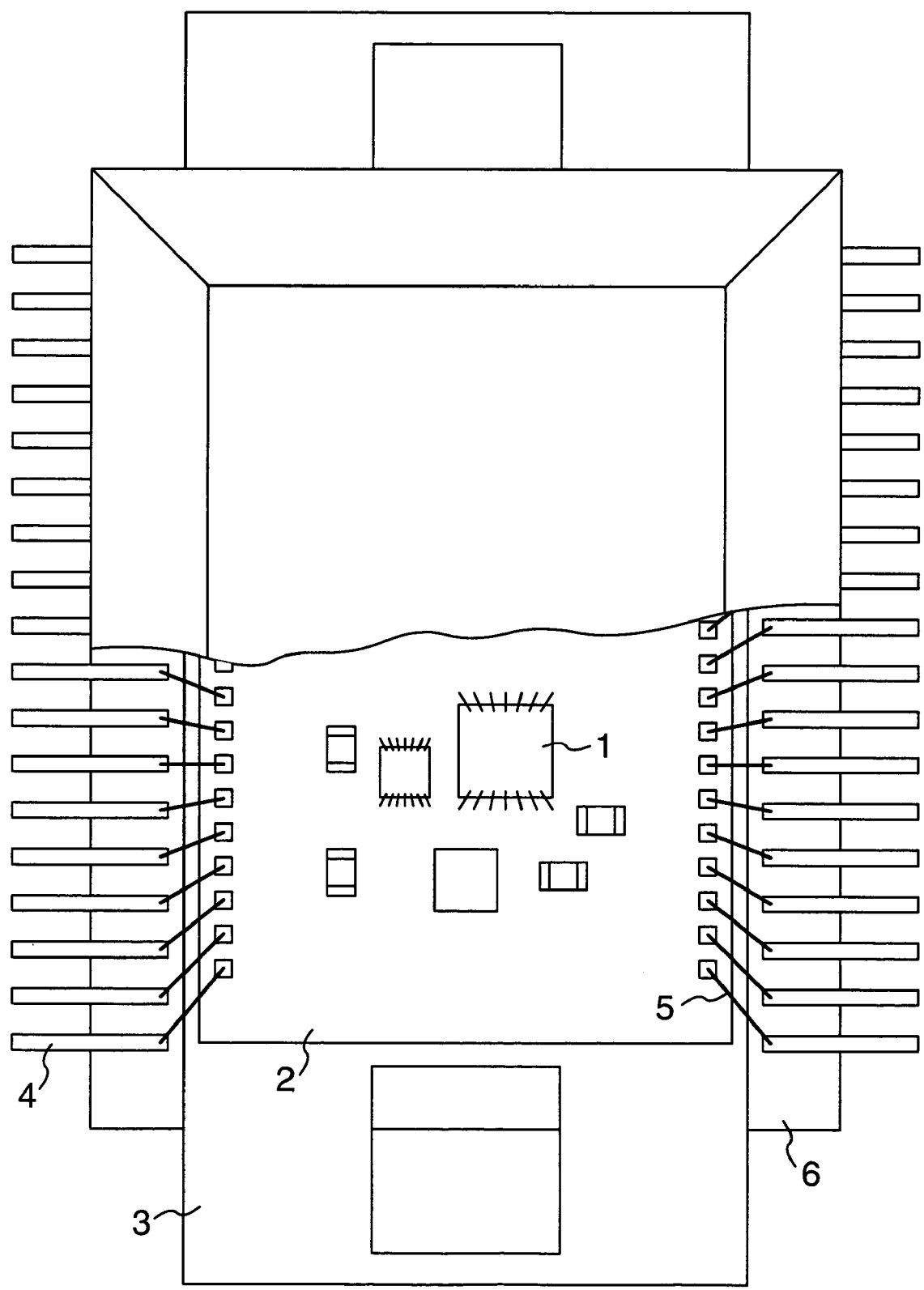
FIG. 20 is a partially cross sectional upper view of an electronic circuit device as a comparative sample.
Figure 21:
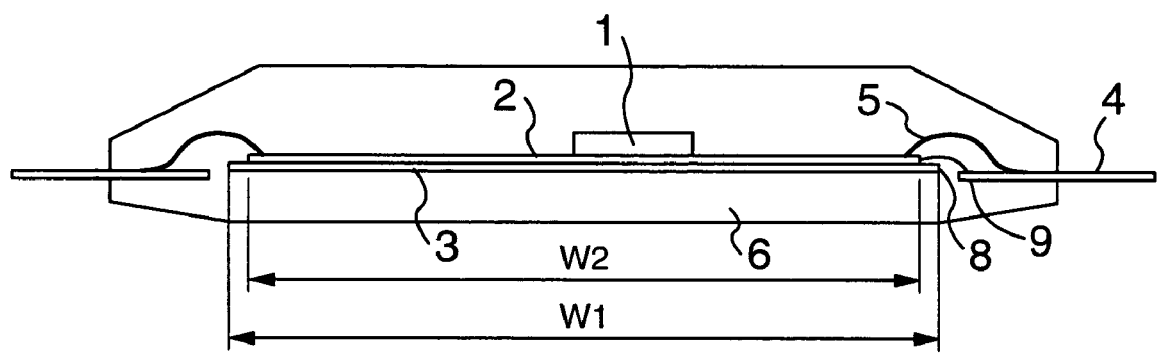
FIG. 21 is a cross sectional front view of the electronic circuit device as the comparative sample.
Figure 22:
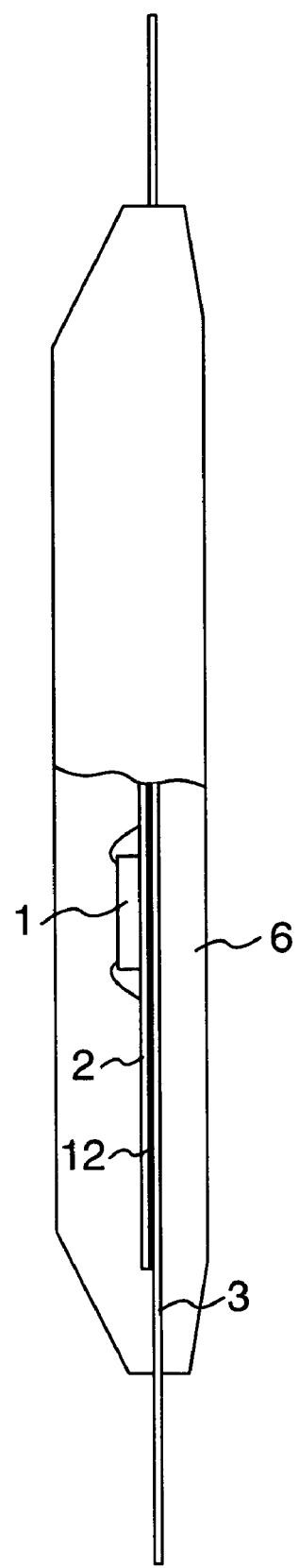
FIG. 22 is a partially cross sectional side view of the electronic circuit device as the comparative sample.

As shown in FIGS. 20-22, in a comparative sample, the ceramic substrate 2 on which the electronic circuit elements 1 are mounted is adhered to the lead frame 3 by the resin adhesive 12, the electronic circuit elements 1 are electrically connected to the metallic leads 4 through the aluminum wires 5, and the electronic circuit elements 1, substrate 2, the part of the lead frame 3 and parts of the leads 4 are sealed by the resin 6. The width W1 of the lead frame 3 in the transverse direction is larger than the width W2 of the substrate 2 in the transverse direction. The coefficients of linear expansion of the substrate 2, lead frame 3 and resin 6 of the comparative sample are substantially equal to those of the above described first embodiment.

Figure 19:
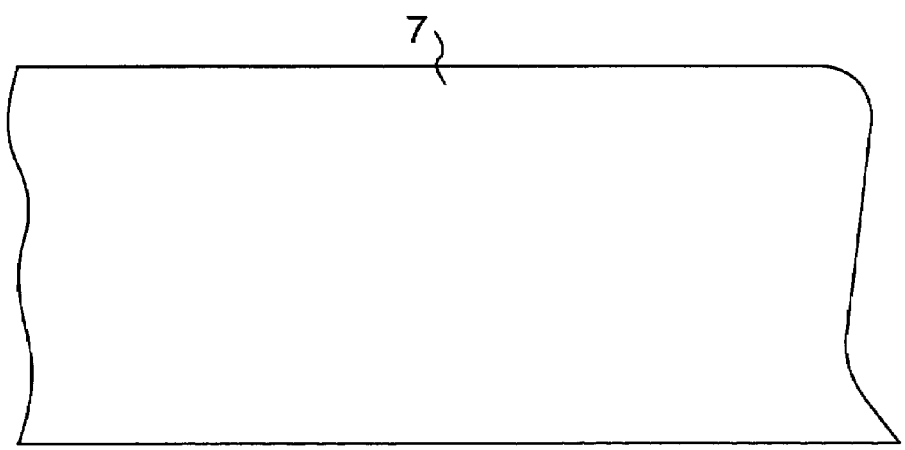
FIG. 19a is a cross sectional view of an end of a lead frame formed by a shearing process.
FIG. 19b is a cross sectional view of an end of a lead frame formed by an etching process.
Figure 19:
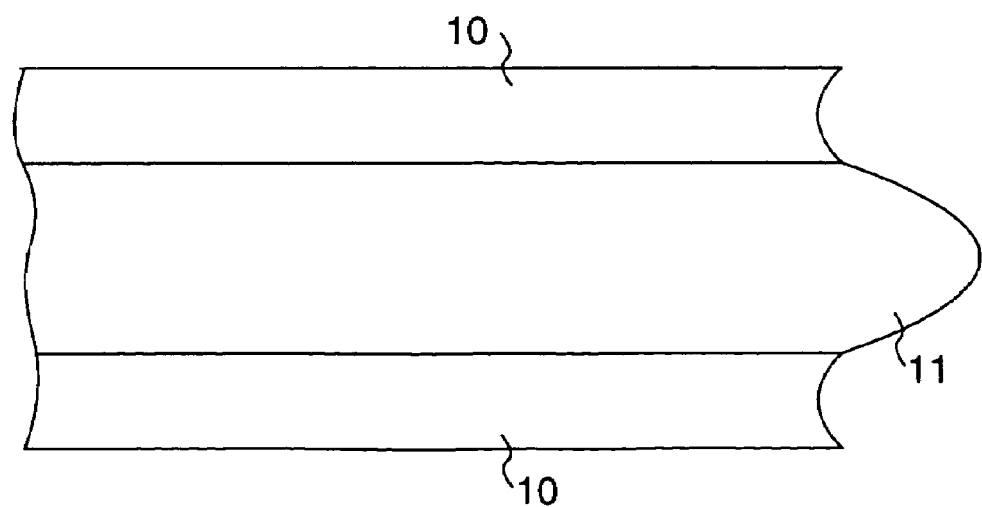

The lead frame 3 is shaped from a sheet alloy material 7 through an etching process or a shearing process. In FIG. 19*a* showing the end 8 of the lead frame 3 shaped by the shearing process in which a punching die proceeds from an upper surface to a lower surface of the sheet alloy material 7 in FIG. 19*a*, a protruding cusp is formed at a lower end edge of the lead frame 3. In FIG. 19*b* showing the end 8 of the lead frame 3 as the stack of the pair of Cu plates 10 and the Inver plate 11 shaped by the etching process, the protruding cusp is formed at each of lower and upper end edges of the lead frame 3. The protruding cusp increases a degree of stress concentration so that an occurrence of a break between the lead frame 3 and resin 6 and/or a crack of the resin at the protruding cusp is expedited. Therefore, according to the present invention, a relationship between the substrate and the end 8 of the lead frame 3 restrains the occurrence of the break between the lead frame 3 and resin 6 and/or the crack of the resin at the protruding cusp.

Figure 6:
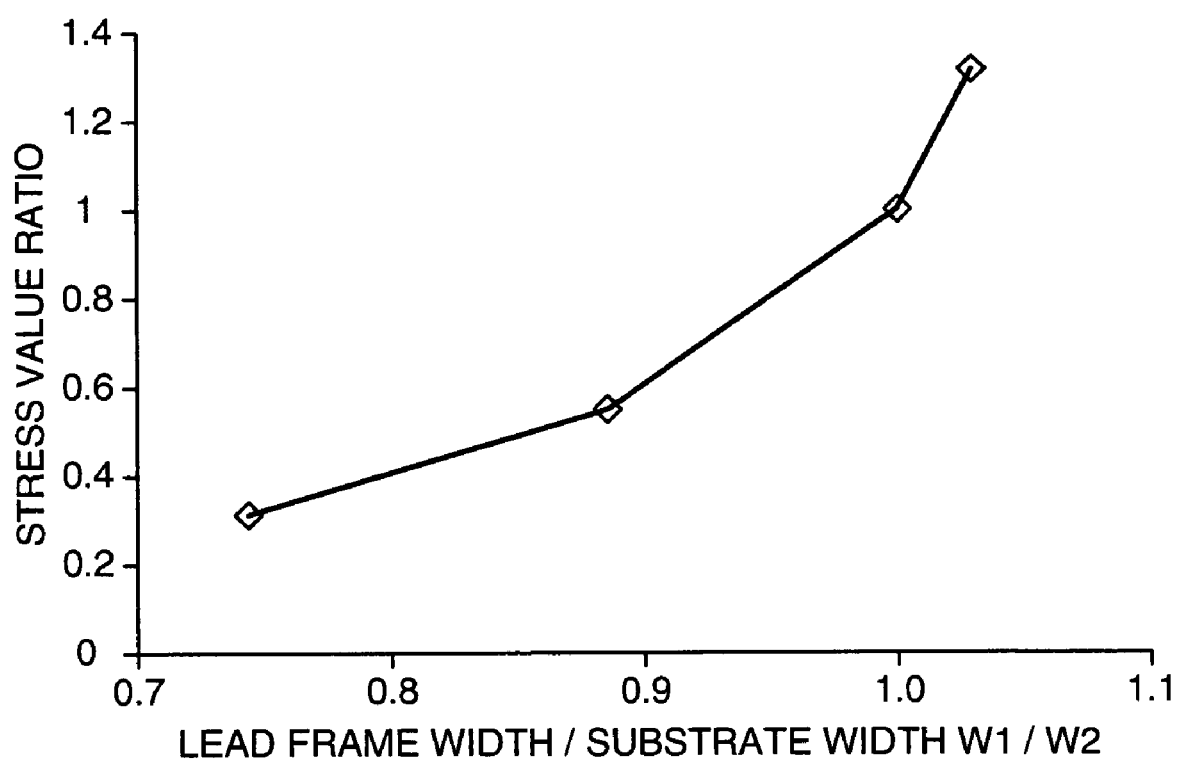
FIG. 6 is a diagram showing a relationship between a ratio of lead frame width W1/substrate width W2 and a ratio of stress in resin at end of lead frame changing in accordance with a change in ratio of lead frame width W1/substrate width W2 and stress in resin at end of lead frame obtained when lead frame width W1=substrate width W2.

In FIG. 6 showing a result of a stress analysis by a finite element method on the first embodiment and comparative sample within a temperature range between −55° C. and 150° C. while the width W2 of the substrate 2 is fixed and the width W1 of the lead frame 3 is changed so that a ratio of the width W1/the width W2 is changed, a stress value ratio between a stress value generated at the end 8 of the lead frame 3 obtained at each of ratios of the width W1/the width W2 different from each other and a stress value generated at the end 8 of the lead frame 3 obtained when the ratio of the width W1/the width W2 is 1, that is, the width W1=the width W2, decreases in accordance with a decrease of ratio between the width W1 and the width W2. From FIG. 6, it is readable that for restraining the occurrence of the break between the lead frame 3 and resin 6 and/or the crack of the resin at the protruding cusp, the ratio of the width W1/the width W2 is preferably less than 1, more preferably not more than 0.8.

If the electronic circuit elements 1 include a central processing unit (CPU) and/or power transistor generating a large heat energy, it is preferable for restraining the occurrence of the break between the lead frame 3 and resin 6 and/or the crack of the resin at the protruding cusp that as seen in the thickness direction the central processing unit (CPU) and/or power transistor overlaps with the lead frame 3.

The ceramic substrate 2 is formed through a green sheet forming process in which a mixture of ceramic material powder and solvent is shaped to a green sheet corresponding to the substrate 2 and a sintering process in which the ceramic material powder is sintered in high temperature. The end 9 of the ceramic substrate 2 does not have the protruding cusp on which the stress concentration occurs so that the occurrence of the break between the substrate 2 and resin 6 and/or the crack of the resin at the end 9 of the substrate 2 is prevented.

Figure 7:
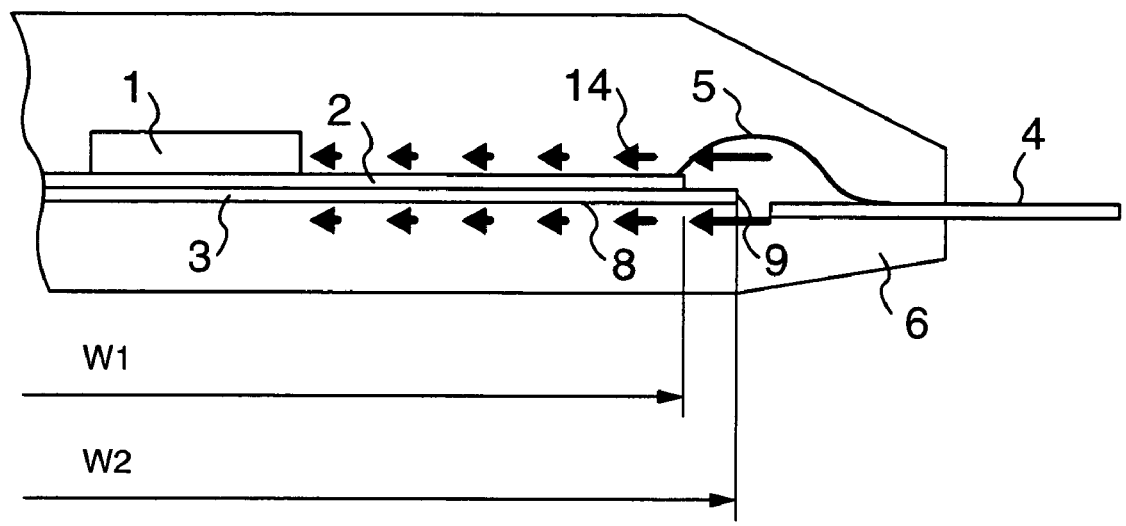
FIG. 7 is a schematic view showing a stress distribution in a comparative sample.
Figure 8:
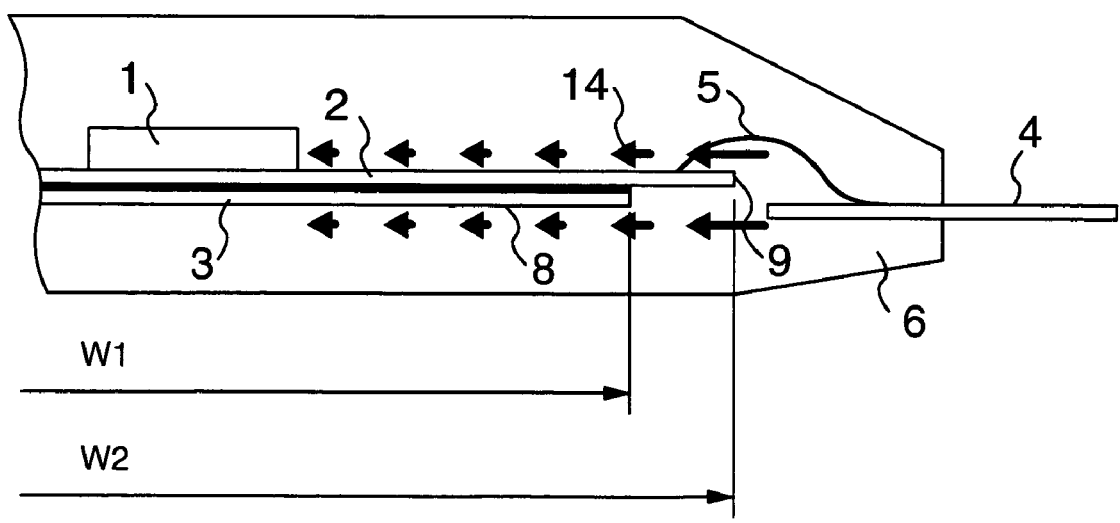
FIG. 8 is a schematic view showing a stress distribution in an embodiment of the invention.
Figure 9:
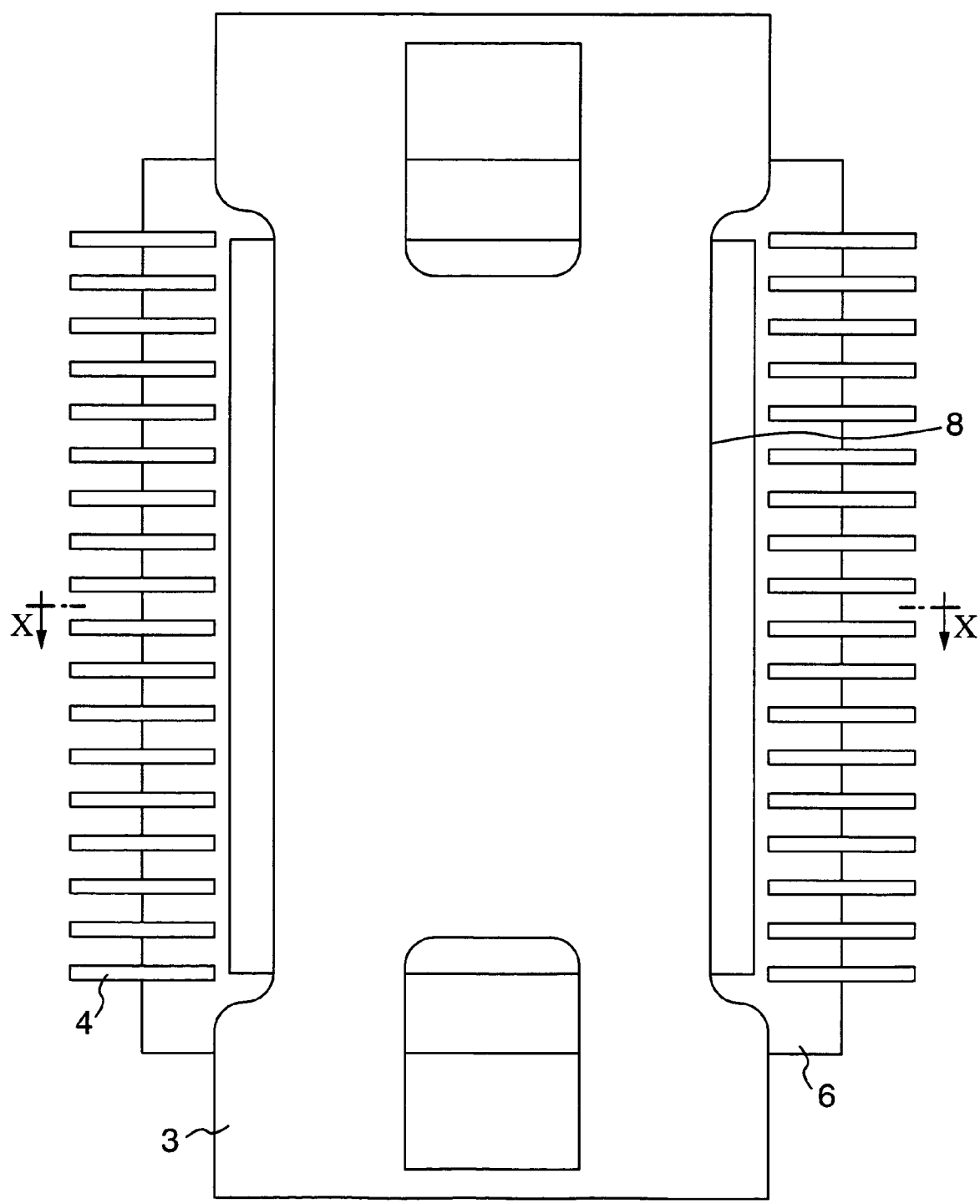
FIG. 9 is a lower view of an electronic circuit device as a second embodiment of the invention.
Figure 10:
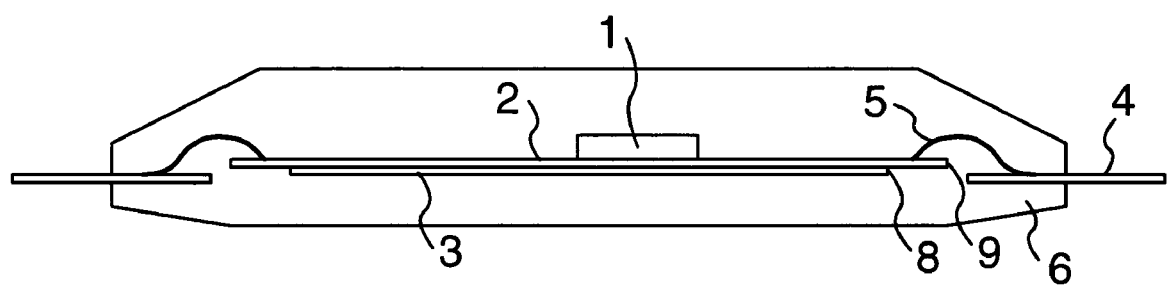
FIG. 10 is a cross sectional front view of the electronic circuit device as the second embodiment taken along a line X-X in FIG. 9.
Figure 12:
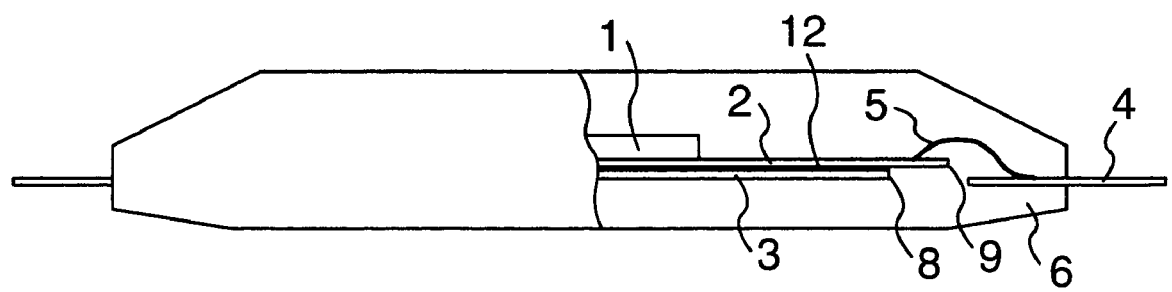
FIG. 12 is a partially cross sectional front view of the electronic circuit device as the second embodiment
Figure 11:
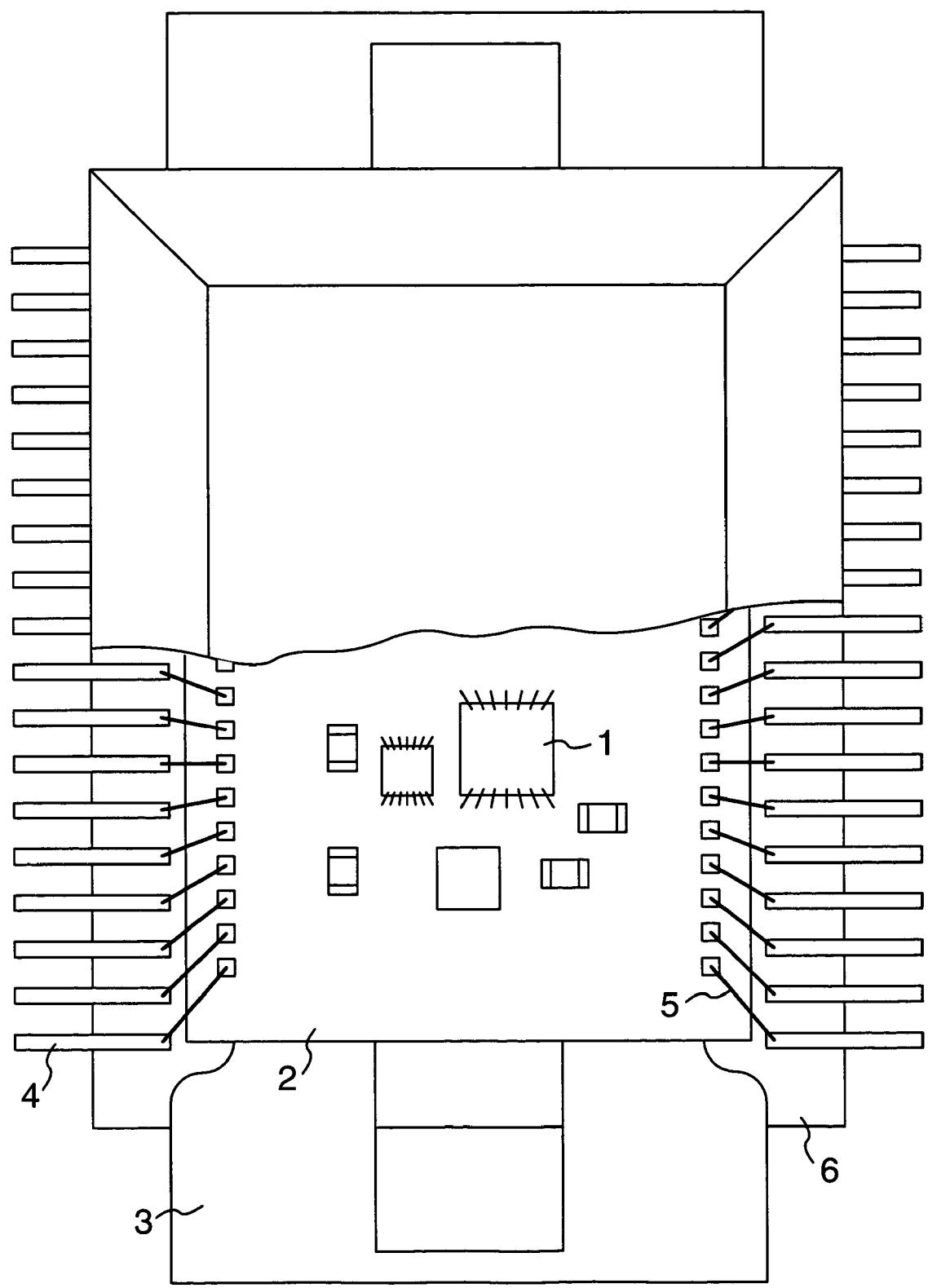
FIG. 11 is a partially cross sectional upper view of the electronic circuit device as the second embodiment.
Figure 13:
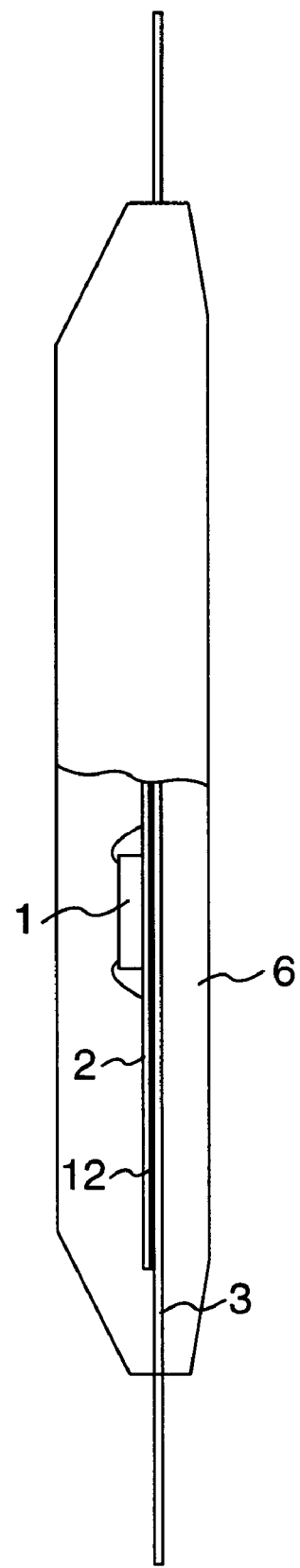
FIG. 13 is a partially cross sectional side view of the electronic circuit device as the second embodiment

As shown in FIGS. 7 and 8, a distribution of shearing stress in a width direction parallel to a boundary face between the substrate 2 and lead frame 3 is generated between the resin 6 and each the substrate 2 and lead frame 3 in each of the embodiment and comparative sample, because of a significant difference in coefficient of linear expansion therebetween. When a thermal cycle test within the temperature range between −55° C. and 150° C. is applied to the embodiment and comparative sample, the shearing stress becomes substantially zero at 150° C. because the resin is softened, and the shearing stress becomes significantly great at −55° C., because the coefficient of linear expansion of the resin 6 (contraction rate with respect to temperature decrease) is significantly greater than that of each of the substrate 2 and lead frame 3. In the distribution of shearing stress, the farther a position is from a central position of each of the substrate 2 and lead frame 3 in the width direction, the greater the shearing stress between the resin 6 and each the substrate 2 and lead frame 3 is.

In the comparative sample, as shown in FIG. 7, the maximum shearing stress generated at the end 8 of the lead frame 3 in the width direction is greater that the maximum shearing stress generated at the end 9 of the substrate 2 in the width direction. In the embodiment, as shown in FIG. 8, the maximum shearing stress generated at the end 8 of the lead frame 3 in the width direction is smaller that the maximum shearing stress generated at the 9 of the substrate 2 in the width direction. A stress concentration for the shearing stress at the end of one of the lead frame 3 and the substrate 2 is restrained when another one of the lead frame 3 and the substrate 2 projects outward in the width direction with respect to the one of the lead frame 3 and the substrate 2, that is, from the end of the one of the lead frame 3 and the substrate 2, and is decreased by a smooth and round (not cusp shape) corner of the end 9 of the ceramic substrate 2. Therefore, in accordance with the present invention in which the ceramic substrate 2 projects outward in the width direction from the end 8 of the lead frame 3, the occurrence of the break between the lead frame 3 and resin 6 and/or the crack of the resin 6 at the end 8 of the lead frame 3 is prevented while the occurrence of the break between the substrate 2 and resin 6 and/or the crack of the resin 6 at the end 9 of the substrate 2 is prevented by the smooth and round (not cusp shape) corner of the end 9 of the substrate 2.

In a second embodiment as shown in FIGS. 9-13, a width of a part of the lead frame 3 projecting outward from the resin 6 is greater than another part of the lead frame 3 facing to the substrate 2 in the thickness direction and covered by the resin 6, so that a thermal radiation effect from the lead frame 3 to an environment around the device is increased.

Figure 14:
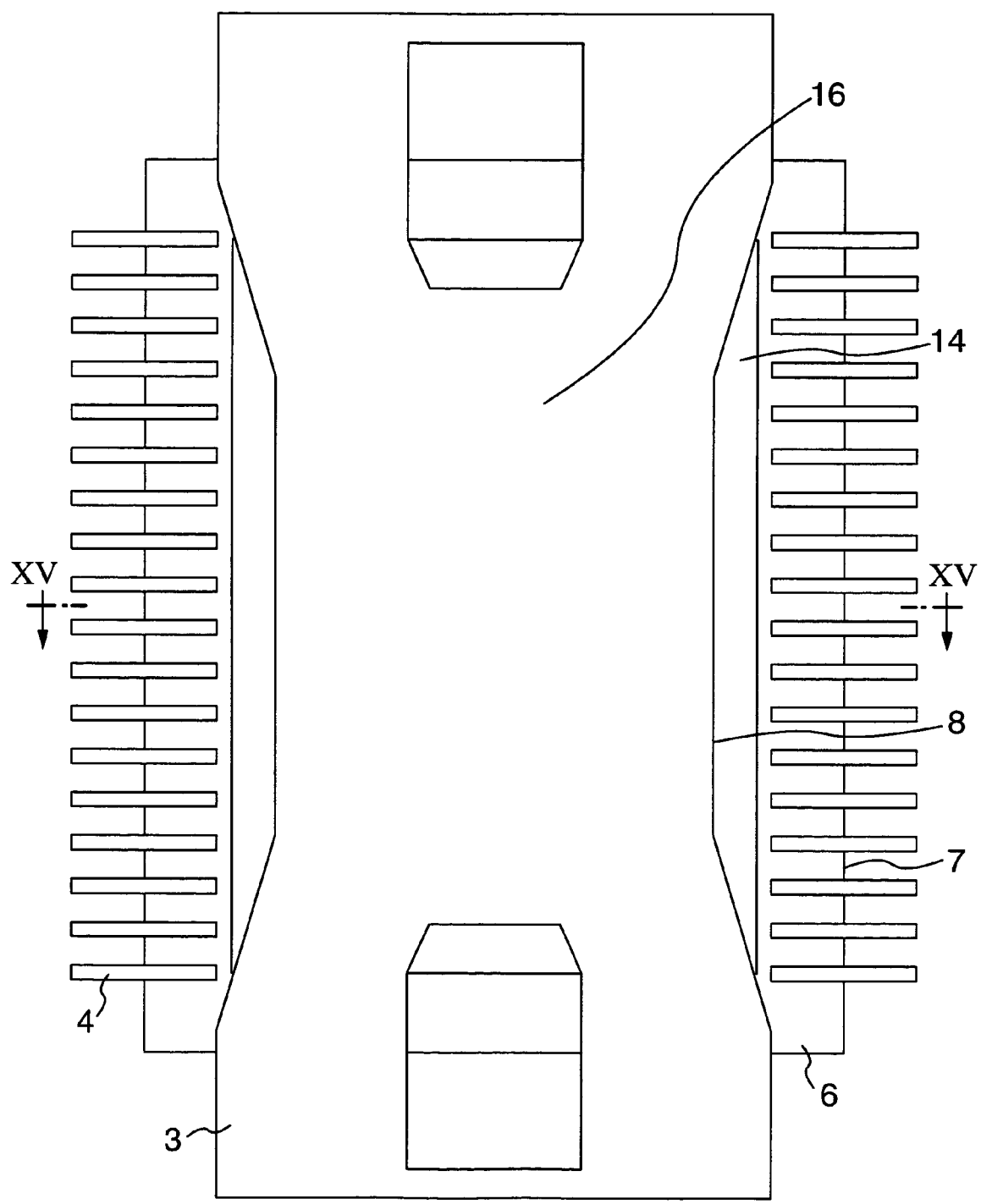
FIG. 14 is a lower view of an electronic circuit device as a third embodiment of the invention.
Figure 15:
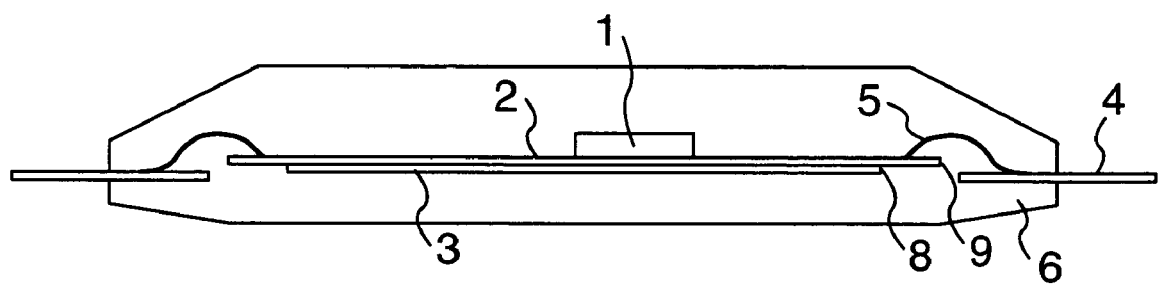
FIG. 15 is a cross sectional front view of the electronic circuit device as the third embodiment taken along a line XV-XV in FIG. 14.

In a third embodiment as shown in FIGS. 14 and 15, the width of the lead frame 3 increases gradually from the another part thereof to the part thereof so that a stress concentration caused by an abrupt change of the width of the lead frame 3 is prevented.

Figure 17:
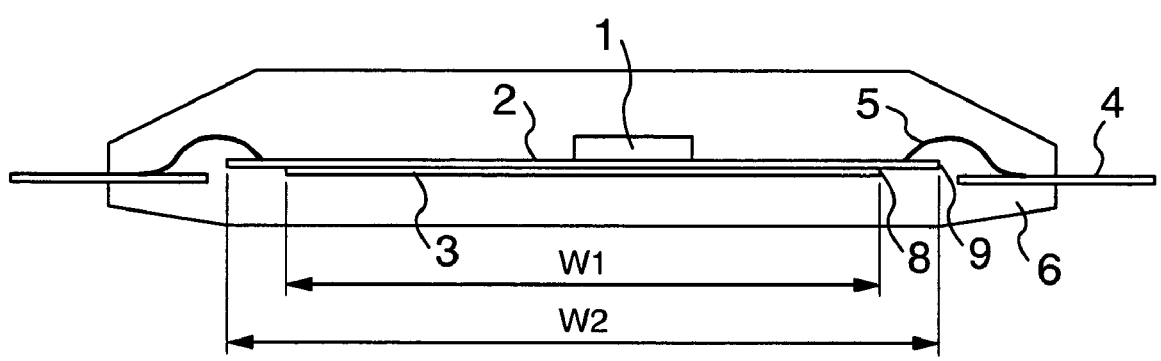
FIG. 17 is a cross sectional front view of the electronic circuit device as the fourth embodiment taken along a line XVII-XVII in FIG. 16.
Figure 16:
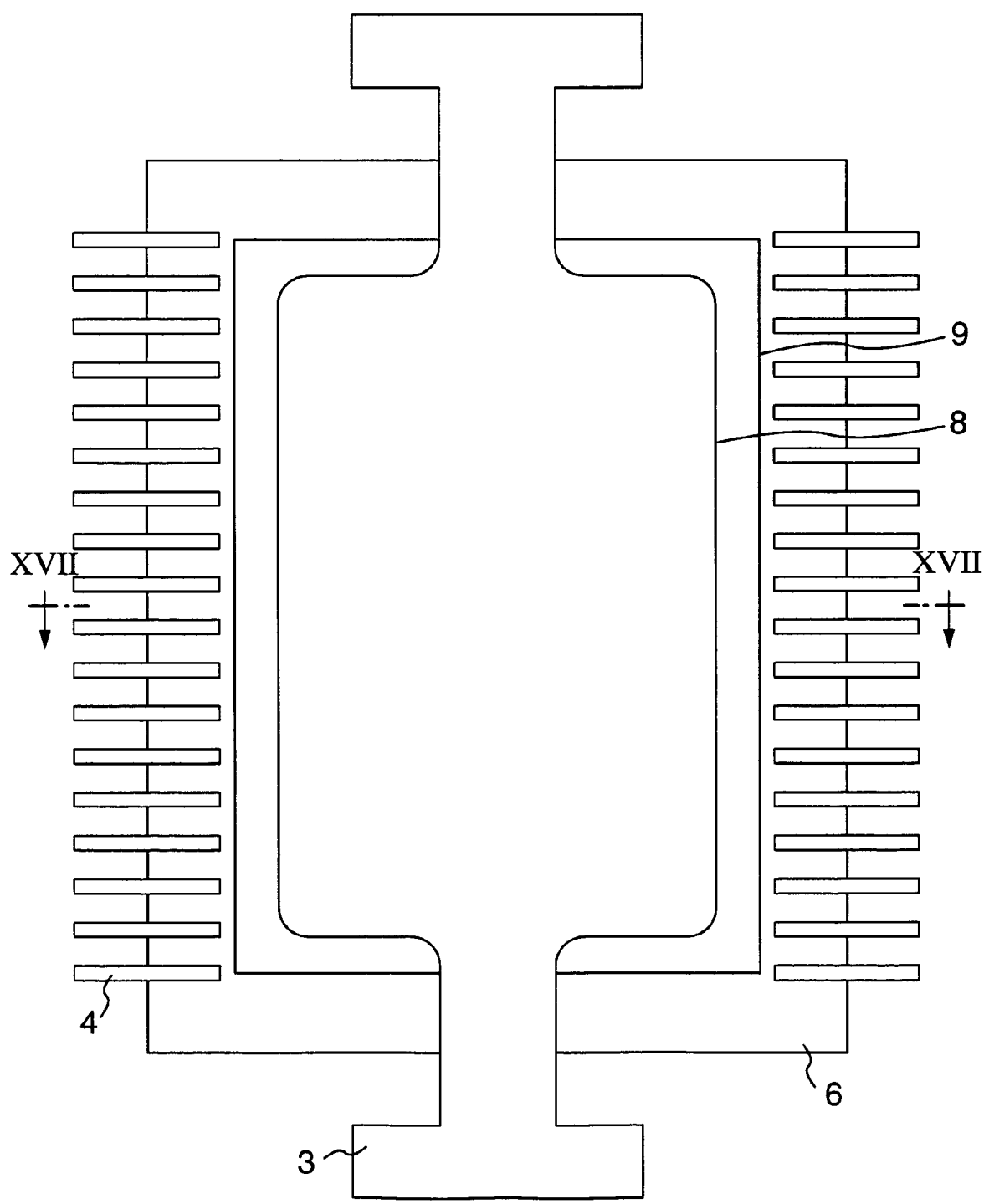
FIG. 16 is a lower view of an electronic circuit device as a fourth embodiment of the invention.
Figure 18:
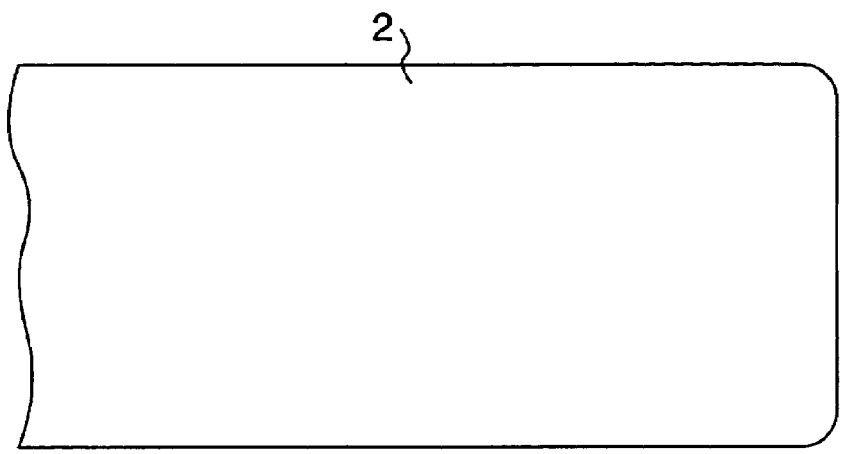
FIG. 18 is a cross sectional view of an end of substrate.

In a fourth embodiment as shown in FIGS. 16 and 17, since the lead frame 3 has a constriction of width between the another part and the part thereof, a thermal conduction from the part to the another part through the lead frame 3 is decreased by the constriction of width to prevent an abrupt change in temperature of the lead frame 3 so that the crack of the resin 6 adjacent to a boundary between the part of the lead frame 3 and the resin 6 is prevented from being formed by a stress generated by the abrupt change in temperature, that is, in expansion of the lead frame 3, even when the electronic circuit device is electrically connected to a printed board by soldering with increasing abruptly the temperature of the part of the lead frame 3.

The invention claimed is:

1. An electronic circuit device comprising,
    an electronic circuit element,
    a substrate including a front surface on which the electronic circuit element is mounted and a reverse surface opposite to the front surface in a thickness direction of the substrate,
    an electrically conductive terminal member electrically connected to the electronic circuit element, a lead frame extending perpendicular to the thickness direction to face the reverse surface in the thickness direction, and a sealing resin covering at least partially the electronic circuit element, substrate and lead frame while at least a part of the electrically conductive terminal member is prevented from being covered by the sealing resin to protrude from the sealing resin in a transverse direction perpendicular to the thickness direction and parallel to a longitudinal direction of the at least a part of the electrically conductive terminal member, wherein the substrate extends to project outward with respect to an end of the lead frame in the transverse direction perpendicular to the thickness direction while the end of the lead frame is covered by the sealing resin in a cross sectional view taken along an imaginary plane passing the substrate and lead frame and extending parallel to the thickness direction, the lead frame is formed in one-piece, a part of the lead frame in one-piece is prevented from being covered by the sealing resin to protrude from the sealing resin in a protruding direction perpendicular to the thickness and transverse directions, and the imaginary plane extends perpendicular to the protruding direction.

2. An electronic circuit device according to claim 1, wherein a coefficient of linear expansion of the lead frame in the transverse direction is smaller than a coefficient of linear expansion of the sealing resin.

3. An electronic circuit device according to claim 1, wherein a difference in coefficient of linear expansion in the transverse direction between the substrate and the lead frame is smaller than a difference in coefficient of linear expansion in the transverse direction between the sealing resin and the lead frame.

4. An electronic circuit device according to claim 1, further comprising a resin adhesive through which the lead frame is adhered to the reverse surface.

5. An electronic circuit device according to claim 1, wherein the lead frame is formed through other than a deposition process on the reverse surface.

6. An electronic circuit device according to claim 5, wherein the deposition process includes at least one of spattering and plating.

7. An electronic circuit device according to claim 1, wherein the end of the lead frame is formed by a shearing process.

8. An electronic circuit device according to claim 1, wherein the end of the lead frame is formed by an etching process.

9. An electronic circuit device according to claim 1, wherein the imaginary plane extends parallel to a longitudinal direction of the at least a part of the electrically conductive terminal member.

10. An electronic circuit device according to claim 1, wherein the electronic circuit device comprises a plurality of the electrically conductive terminal members juxtaposed in an electrically conductive terminal member array direction, and the imaginary plane extends perpendicular to the electrically conductive terminal member array direction.

11. An electronic circuit device according to claim 1, wherein the lead frame has a surface facing to the reverse surface in the thickness direction and prevented from being covered by the sealing resin to protrude from the sealing resin in the protruding direction.

12. An electronic circuit device according to claim 1, wherein in the cross sectional view, the substrate extends to project outward in the transverse direction with respect to another end of the lead frame opposite to the end of the lead frame in the transverse direction while the another end of the lead frame is covered by the sealing resin.

13. An electronic circuit device, comprising, an electronic circuit element, a substrate including a front surface on which the electronic circuit element is mounted and a reverse surface opposite to the front surface in a thickness direction of the substrate, an electrically conductive terminal member electrically connected to the electronic circuit element, a lead frame extending perpendicular to the thickness direction to face the reverse surface in the thickness direction, and a sealing resin covering at least partially the electronic circuit element, substrate and lead frame while at least a part of the electrically conductive terminal member is prevented from being covered by the sealing resin to protrude from the sealing resin in a transverse direction perpendicular to the thickness direction and parallel to a longitudinal direction of the at least a part of the electrically conductive terminal member, wherein the substrate extends to project outward with respect to an end of the lead frame in the transverse direction perpendicular to the thickness direction while the end of the lead frame is covered by the sealing resin, in a cross sectional view taken along an imaginary plane passing the substrate and lead frame and extending parallel to the thickness direction, and a part of the lead frame is prevented from being covered by the sealing resin to protrude from the sealing resin in a protruding direction perpendicular to the thickness and transverse directions, and a width between the another end and the end in the cross sectional view is smaller than a width of the part of the lead frame in the transverse direction.

14. An electronic circuit device according to claim 12, wherein in the cross sectional view, a width of the lead frame between the another end and the end is not more than 80% of a width of the substrate.

15. An electronic circuit device according to claim 1, wherein the electronic circuit element includes a semiconductor body whose main component is a semiconductor, and as seen in the thickness direction, the semiconductor body and the lead frame overlap with each other.

16. An electronic circuit device according to claim 15, wherein the electronic circuit element includes at least one of a central processing unit and a power transistor.

17. An electronic circuit device according to claim 15, wherein as seen in the thickness direction, the whole of the semiconductor body overlaps with the lead frame.

18. An electronic circuit device according to claim 1, wherein the lead frame is prevented from being electrically connected to the electronic circuit element.

19. An electronic circuit device according to claim 1, wherein the lead frame is metallic, and a main component of the substrate is a ceramic.

20. An electronic circuit device comprising, an electronic circuit element, a substrate including a front surface on which the electronic circuit element is mounted and a reverse surface opposite to the front surface in a thickness direction of the substrate, an electrically conductive terminal member electrically connected to the electronic circuit element, a lead frame extending perpendicular to the thickness direction to face the reverse surface in the thickness direction, and a sealing resin covering at least partially the electronic circuit element, substrate and lead frame while at least a part of the electrically conductive terminal member is prevented from being covered by the sealing resin to protrude from the sealing resin in a transverse direction perpendicular to the thickness direction and parallel to a longitudinal direction of the at least a part of the electrically conductive terminal member, wherein the substrate extends to project outward with respect to an end of the lead frame in the transverse direction perpendicular to the thickness direction while the end of the lead frame is covered by the sealing resin, and in a cross sectional view taken along an imaginary plane passing the substrate and lead frame and extending parallel to the thickness direction, the lead frame has first and second surfaces opposite to each other in the thickness direction, in which the first surface fronts the reverse surface of the substrate in the thickness direction the second surface as a reverse surface of the lead frame with respect to the first surface is arranged so as to be prevented from fronting the reverse surface of the substrate in the thickness direction, and the second surface is covered by the sealing resin.

21. An electronic circuit device according to claim 20, wherein the lead frame has a side surface between the first and second surface, with a corner between the second surface and the side surface, and the corner is covered by the sealing resin.

* * * * *